(12) United States Patent
Kanezawa

(10) Patent No.: US 11,275,044 B2
(45) Date of Patent: Mar. 15, 2022

(54) ANOMALY DETERMINATION METHOD AND WRITING APPARATUS

(71) Applicant: NUFLARE TECHNOLOGY, INC., Yokohama (JP)

(72) Inventor: Shun Kanezawa, Sunto (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 162 days.

(21) Appl. No.: 16/502,431

(22) Filed: Jul. 3, 2019

(65) Prior Publication Data
US 2020/0072777 A1  Mar. 5, 2020

(30) Foreign Application Priority Data

Aug. 31, 2018  (JP) .............................. JP2018-163839

(51) Int. Cl.
*G01N 27/20*  (2006.01)
*G01N 27/04*  (2006.01)
*H01J 37/244*  (2006.01)
*H01J 37/317*  (2006.01)

(52) U.S. Cl.
CPC ........... *G01N 27/20* (2013.01); *G01N 27/041* (2013.01); *H01J 37/244* (2013.01); *H01J 37/3174* (2013.01); *H01J 2237/31754* (2013.01); *H01J 2237/31798* (2013.01)

(58) Field of Classification Search
None
See application file for complete search history.

(56) References Cited

U.S. PATENT DOCUMENTS 8,742,376 B2   6/2014 Ohnishi
2014/0001380 A1*  1/2014 Ohnishi ................. B82Y 10/00
                                                              250/492.3

(Continued)

FOREIGN PATENT DOCUMENTS

JP   10-303093 A    11/1998
JP   2007-207117     8/2007
JP   2007-258536    10/2007

(Continued)

OTHER PUBLICATIONS

Tsunoda Masahiro et al.; Electron Beam Lithography System; Nov. 13, 1998; Hitachi LTD; JPH10303093 (A); H01J37/20; H01L21/027 (Year: 1998).*

(Continued)

*Primary Examiner* — Nasima Monsur
(74) *Attorney, Agent, or Firm* — Oblon, McClelland, Maier & Neustadt, L.L.P.

(57) ABSTRACT

An anomaly determination method of the present embodiment includes: measuring a first resistance value of a processing target via a first grounding member when the first grounding member is attached to the processing target in a first chamber; bringing the first grounding member into contact with a grounded second grounding member to measure a second resistance value of the processing target via the first and second grounding members in a second chamber; and determining an anomaly of the second grounding member with an arithmetic processing unit based on a trend of a resistance difference between the first resistance value and the second resistance value for a plurality of processing targets.

15 Claims, 12 Drawing Sheets

(56) References Cited

U.S. PATENT DOCUMENTS

2016/0172720 A1     6/2016  Lammeren
2016/0263625 A1*    9/2016  Kanezawa ............ B08B 7/0028

FOREIGN PATENT DOCUMENTS

| JP | 2010-152250 | 7/2010 |
|----|-------------|--------|
| JP | 2011-107927 | 6/2011 |
| JP | 4705484 | 6/2011 |
| JP | 2012-176832 | 9/2012 |
| JP | 5059084 | 10/2012 |
| JP | 5257844 | 8/2013 |
| JP | 2014-11374 | 1/2014 |
| JP | 2016-115678 | 6/2016 |
| KR | 10-2014-0004028 A | 1/2014 |

OTHER PUBLICATIONS

Combined Taiwanese Office Action and Search Report dated Nov. 26, 2020 in Taiwanese Patent Application No. 108125052 (with English translation), 12 pages.
Korean Office Action dated Nov. 10, 2020 Korean Patent Application No. 10-2019-0102774 (with English translation), 10 pages.
Chinese Office Action dated May 27, 2021 in Chinese Application No. 201910812777.0 with English translation, 16 pgs.

* cited by examiner

ANOMALY DETERMINATION METHOD AND WRITING APPARATUS

CROSS REFERENCE TO RELATED APPLICATIONS

This application is based upon and claims the benefit of priority from the prior Japanese Patent Application No. 2018-163839, filed on Aug. 31, 2018, the entire contents of which are incorporated herein by reference.

FIELD

The embodiments of the present invention relate to an anomaly determination method and a writing apparatus.

BACKGROUND

A mask writing apparatus is an apparatus to write a desired pattern on a mask substrate (blank) made of a substrate (mainly, a glass substrate) and a light shielding film (for example, chromium (Cr)) formed on the substrate by irradiating the mask substrate with a charged particle beam. The mask substrate has a resist film formed on its surface. The resist film is exposed to the charged particle beam to write a desired pattern. Writing with the charged particle beam is performed while the mask substrate is being grounded. This is because when electric charges are accumulated in the mask substrate caused by the charged particle beam, the trajectory of the charged particle beam may be bent or the charged particle beam may be scattered to cause blurring.

In order to ground the mask substrate, in mask writing apparatus, a grounding body for grounding is set on the mask substrate and then the grounding body is brought into contact with a grounding spring to perform writing with a charged particle beam. Electric charges accumulated in the mask substrate caused by the charged particle beam are discharged via the grounding body and the grounding spring, so that electrification of the mask substrate can be prevented.

However, when a contact resistance value (resistance value, hereinafter) between the grounding body and the grounding spring becomes larger, the mask substrate cannot be grounded sufficiently which causes a grounding error.

The cause of such increase in resistance value may be change or degradation of the grounding spring surface. Conventionally, the cause of the grounding error is investigated after the occurrence of the grounding error. Then, when it is found out that the change or degradation of the grounding spring is the cause, the position of the mask substrate on the grounding spring is shifted or the grounding body is replaced with a new one, in order to shift a contact point between the grounding body and the grounding spring. The grounding spring itself is replaced with a new one as required.

SUMMARY OF THE INVENTION

A method of the present embodiment is an anomaly determination method using a writing apparatus, the writing apparatus including a first chamber capable of attaching a first grounding member to a processing target to ground the processing target or of accommodating the processing target for positioning the processing target, a second chamber capable of accommodating the processing target for writing a predetermined pattern to the processing target with a charged particle beam, and an arithmetic processing unit determining a resistance value of the processing target, the method includes: measuring a first resistance value of the processing target via the first grounding member when the first grounding member is attached to the processing target or positioning of the processing target is performed, in the first chamber; bringing the first grounding member into contact with a grounded second grounding member to measure a second resistance value of the processing target via the first and second grounding members, in the second chamber; and determining an anomaly of the second grounding member with the arithmetic processing unit based on a trend of a resistance difference between the first resistance value and the second resistance value for a plurality of processing targets.

The arithmetic processing unit may determine the anomaly of the second grounding member based on a number of times the resistance difference surpasses a first threshold value.

The arithmetic processing unit may determine that there is an anomaly in the second grounding member when the number of times surpasses a second threshold value.

The arithmetic processing unit may determine the anomaly of the second grounding member based on a frequency at which the resistance difference surpasses a first threshold value.

The arithmetic processing unit may determine the anomaly of the second grounding member based on a frequency at which the resistance difference surpasses the first threshold value.

The arithmetic processing unit may determine the anomaly of the second grounding member based on a frequency at which the resistance difference surpasses the first threshold value.

The method may further include: writing the predetermined pattern to the processing target with the charged particle beam in the second chamber when it is determined that there is no anomaly in the second grounding member; and shifting a contact point of the first grounding member with respect to the second grounding member when it is determined that there is an anomaly in the second grounding member.

The method may further include: writing the predetermined pattern to the processing target with the charged particle beam in the second chamber when it is determined that there is no anomaly in the second grounding member; and shifting a contact point of the first grounding member with respect to the second grounding member when it is determined that there is an anomaly in the second grounding member.

The method may further include: writing the predetermined pattern to the processing target with the charged particle beam in the second chamber when it is determined that there is no anomaly in the second grounding member; and shifting a contact point of the first grounding member with respect to the second grounding member when it is determined that there is an anomaly in the second grounding member.

The method may further include: writing the predetermined pattern to the processing target with the charged particle beam in the second chamber when it is determined that there is no anomaly in the second grounding member; and shifting a contact point of the first grounding member with respect to the second grounding member when it is determined that there is an anomaly in the second grounding member.

A writing apparatus of the present embodiment includes: a first chamber capable of attaching a first grounding member to a processing target to ground the processing targets or of accommodating the processing target for positioning the processing target; a second chamber capable of accommodating the processing target for writing a predetermined pattern to the processing target with a charged particle beam; a first resistance measuring unit measuring a first resistance value of the processing target via the first grounding member when positioning the processing target in the first chamber or when the first grounding member grounding the processing target is attached to the processing target; a second resistance measuring unit bringing the first grounding member into contact with a grounded second grounding member and measuring a second resistance value of the processing target mounted on the second grounding member via the first and second grounding members, when writing to the processing target in the second chamber; and an arithmetic processing unit determining an anomaly of the second grounding member based on a trend of a resistance difference between the first resistance value and the second resistance value for a plurality of processing targets.

The arithmetic processing unit may determine the anomaly of the second grounding member based on a number of times the resistance difference surpasses a first threshold value.

The arithmetic processing unit may determine the anomaly of the second grounding member when the number of times surpasses a second threshold value.

The arithmetic processing unit may determine the anomaly of the second grounding member based on a frequency at which the resistance difference surpasses a first threshold value.

When it is determined that there is no anomaly in the second grounding member, the predetermined pattern may be written to the processing target with the charged particle beam in the second chamber; and when it is determined that there is an anomaly in the second grounding member, a contact point of the first grounding member with respect to the second grounding member may be shifted.

DETAILED DESCRIPTION

Figure 1A:
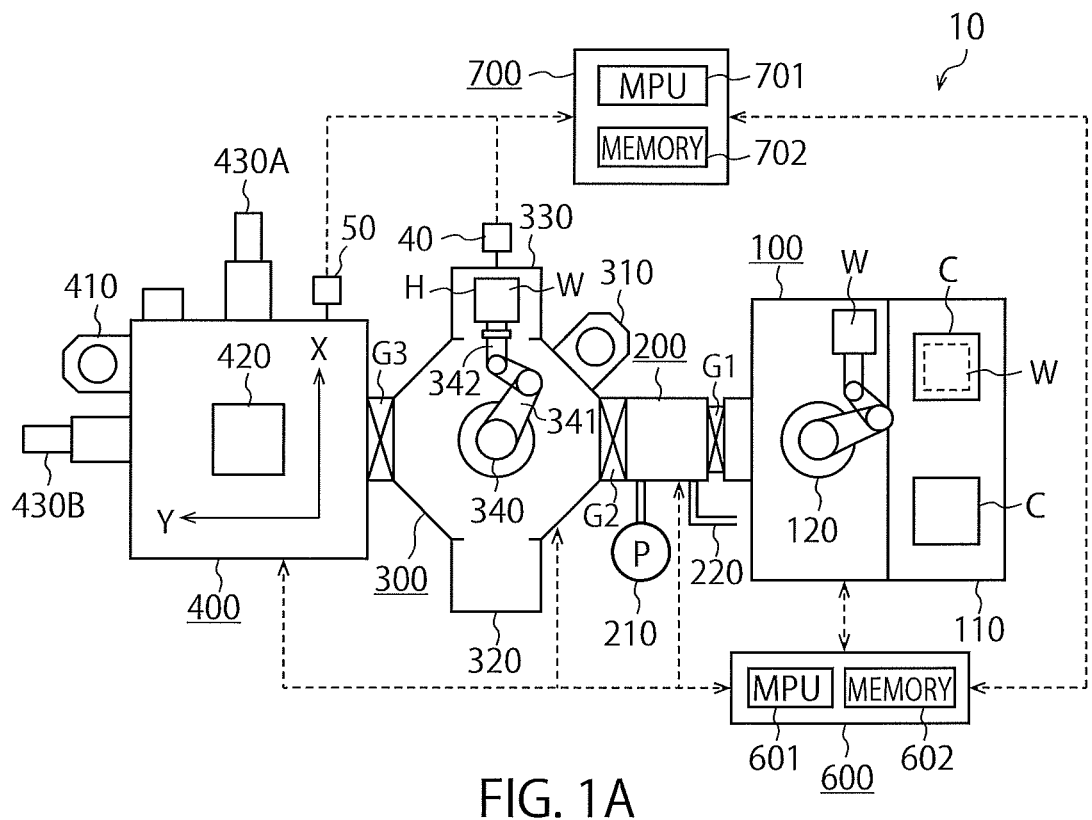
FIGS. 1A and 1B are schematic views of a mask writing apparatus according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

First Embodiment

Figure 1B:
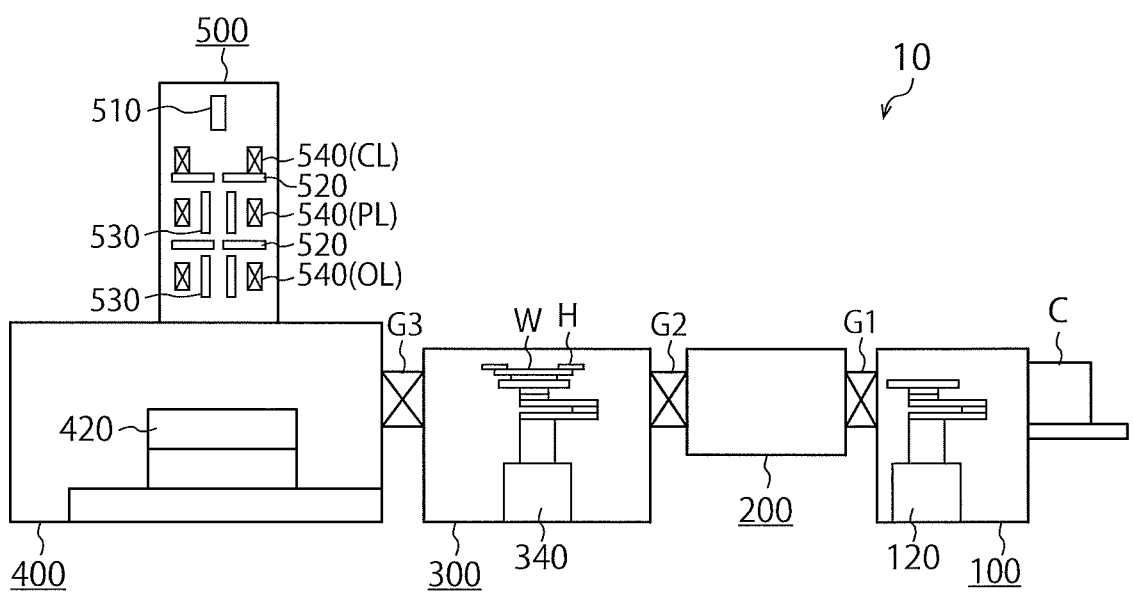

FIGS. 1A and 1B are schematic views of a mask writing apparatus 10 according to a first embodiment. FIG. 1A is a schematic plan view of the mask writing apparatus 10. FIG. 1B is a schematic sectional view of the mask writing apparatus 10. Hereinbelow, with reference to FIGS. 1A and 1B, the configuration of the mask writing apparatus 10 will be explained. In FIG. 1A, the illustration of an electron beam barrel 500 is omitted.

As shown in FIG. 1A, the mask writing apparatus 10 is provided with an interface (I/F) 100, a transfer-in/out (I/O) chamber 200, a robot chamber (R-chamber) 300, a writing chamber (W-chamber) 400, the electron beam barrel 500, a control mechanism 600, an arithmetic processing unit 700, and gate valves G1 to G3. Chain lines in FIG. 1A indicate the flow of a control signal, data, etc.

The I/F 100 is provided with a mounting table 110, mounted on which is a container C (for example, SMIF Pod) having a mask substrate W housed therein, and a transfer robot 120 for transferring the mask substrate W.

The I/O chamber 200 is a so-called load lock chamber for transferring-in and -out the mask substrate W while maintaining the inside of the R-chamber 300 in a vacuum state (low pressure). The I/O chamber 200 is provided with a gate valve G1 between itself and the I/F 100, and provided further with a vacuum pump 210 and a gas supply system 220. The vacuum pump 210 is, for example, a dry pump, a turbomolecular pump, and so on, to evacuate the inside of the I/O chamber 200. The gas supply system 220 supplies a vent gas (for example, nitrogen gas or CDA) into the I/O chamber 200 when setting the pressure in the I/O chamber 200 to an atmospheric pressure.

When evacuating the inside of the I/O chamber 200, the vacuum pump 210 connected to the I/O chamber 200 is used for evacuation. When returning the inside of the I/O chamber 200 to the atmospheric pressure, the vent gas is supplied into the I/O chamber 200 from the gas supply system 220 to set the inside of the I/O chamber 200 to the atmospheric pressure. When evacuating the inside of the I/O chamber 200 and when setting the inside thereof to the atmospheric pressure, the gate valves G1 and G2 are closed.

The R-chamber 300 is provided with a vacuum pump 310, an alignment chamber (ALN chamber) 320, a grounding body chamber (H-chamber) 330, and a transfer robot 340. The R-chamber 300 is connected to the I/O chamber 200 via the gate valve G2.

The vacuum pump 310 is, for example, a Cryo pump, a turbomolecular pump, and so on. The vacuum pump 310 is connected to the R-chamber 300, for evacuating the inside of the R-chamber 300 to keep the inside at high vacuum.

The H-chamber 330 houses a grounding body H for grounding the mask substrate W. The grounding body H covers the outer edge of the mask substrate W to restrict accumulation of electric charges of a charged particle beam (for example, an electron beam) on the outer edge of the mask substrate W. In other words, the grounding body H functions as eaves to the outer edge of the mask substrate W. Moreover, the grounding body H is provided to release the electric charges of the charged particle beam accumulated in the mask substrate W to the ground. The H-chamber 330 can house the mask substrate W in order to attach the grounding body H to the mask substrate W. The H-chamber 330 is provided with a resistance measuring unit 40 for measuring a resistance value of the mask substrate W via the grounding body H while the grounding body H is being set on the mask substrate W. For example, the resistance measuring unit 40 has a plurality of measuring pins which are brought into contact with the grounding body H to measure a resistance value among the measuring pins. In this way, the resistance measuring unit 40 measures a resistance value (first resistance value) of the mask substrate W via the grounding body H. The measurement of the resistance value of the mask substrate W will be explained later with reference to FIGS. 8A and 8B.

The ALN chamber 320 is a chamber for positioning (alignment) of the mask substrate W. In the ALN chamber 320, the alignment of the mask substrate W is performed. During the alignment in the ALN chamber 320, the grounding body H may be placed on standby on an elevation stage, and after the completion of alignment, the grounding body H may be mounted on the mask substrate W in the ALN chamber 320. In this case, like the H-chamber 330, the ALN chamber 320 is provided with the resistance measuring unit 40, so that the resistance value of the mask substrate W can be measured via the grounding body H while the grounding body H is being set on the mask substrate W 400.

The transfer robot 340 is provided with an arm 341 and an end effector 342 attached to an end of the arm 341. The transfer robot 340 transfers the mask substrate W among the I/O chamber 200, the ALN chamber 320, the H-chamber 330, and the W-chamber 400.

The W-chamber 400 is provided with a vacuum pump 410, an X-Y stage 420, and drive mechanisms 430A and 430B, and is connected to the R-chamber 300 via the gate valve G3. The W-chamber 400 can house the mask substrate W for writing a predetermined pattern on the mask substrate W with a charged particle beam.

The vacuum pump 410 is, for example, a Cryo pump, a turbomolecular pump, and so on. The vacuum pump 410 is connected to the W-chamber 400, for evacuating the inside of the W-chamber 400 to keep the inside at high vacuum. The X-Y stage 420 is a table for mounting the mask substrate W thereon. The drive mechanism 430A drives the X-Y stage 420 in an X-direction. The drive mechanism 430B drives the X-Y stage 420 in a Y-direction.

Inside the W-chamber 400, a grounding spring (see FIG. 4) is provided as a second grounding member. The grounding spring is grounded and brought into contact with the grounding body H when the mask substrate W is mounted on the X-Y stage 420. Accordingly, in writing, the mask substrate W is grounded via the grounding body H and the grounding spring. Moreover, the W-chamber 400 is provided with a resistance measuring unit 50 which measures a resistance value (second resistance value) of the mask substrate W via the grounding body H and the grounding spring.

The electron beam barrel 500 in FIG. 1B is provided with a charged-particle beam irradiation means configured with an electron gun 510, an aperture 520, a deflector 530, lenses 540 (illumination lens (CL), projection lens (PL), objective lens (OL)), etc. to irradiate the mask substrate W mounted on the X-Y stage 420 with a charged particle beam.

The control mechanism 600 is, for example, a computer, provided with an MPU 601, a memory 602 (for example, solid state drive (SSD) or hard disk drive (HDD)), etc. The control mechanism 600 controls the operation of the mask writing apparatus 10.

The arithmetic processing unit 700 is, for example, a computer provided separated from the control mechanism 600, provided with an MPU 701, a memory 702 (for example, SSD or HDD), etc. The arithmetic processing unit 700 may be the same computer as the control mechanism 600. The arithmetic processing unit 700 receives the first and second resistance values of the mask substrate W from the resistance measuring units 40 and 50 to store the first and second resistance values and performs arithmetic processing, for determination of an anomaly of the grounding spring. The determination of the anomaly of the grounding spring and the arithmetic processing will be explained later in detail.

(Configuration of Grounding Body H)

Figure 2A:
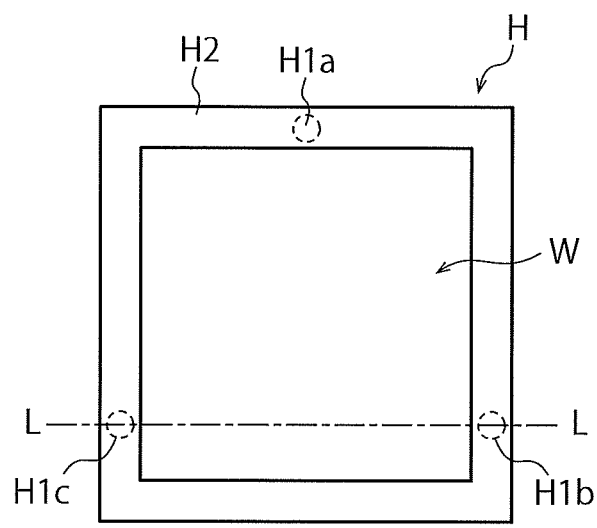
FIGS. 2A and 2B are schematic views of a grounding body.
Figure 2B:
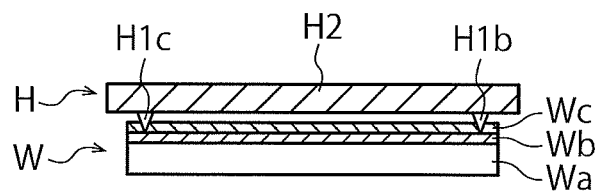

FIGS. 2A and 2B are schematic views of the grounding body H. FIG. 2A is a plan view of the grounding body H. FIG. 2B is a sectional view taken on line L-L in FIG. 2A. Shown in FIGS. 2A and 2B is the grounding body H set on the mask substrate W.

As shown in FIGS. 2A and 2B, the grounding body H is provided with three grounding pins H1$a$ to H1$c$ and a frame H2 which is like a picture frame. For the frame H2 and the grounding pins H1$a$ to H1$c$, a conductive material such as titanium and zirconia is used. The grounding pin H1$a$ is electrically connected to the frame H2, but not grounded. Either one of the grounding pins H1$b$ and H1$c$ is electrically connected to the frame H2. The other one of the grounding pins H1$b$ and H1$c$ is provided to the frame H2 via an insulator to be electrically isolated from the frame H2. The grounding pins H1$b$ and H1$c$ are grounded via the grounding spring. The mask substrate W has a stacked configuration of a light shielding film Wb (for example, chromium (Cr)) and a resist film Wc on a glass substrate Wa.

When the grounding body H is set on the mask substrate W, the grounding pins H1$a$ to H1$c$ of the grounding body H break through the resist film Wc due to their own weights, to be brought into contact with the light shielding film Wb that is a conductor. In this way, the light shielding film Wb of the mask substrate W is grounded via the grounding pins H1$a$ to H1$c$. Because of this, electric charges accumulated in the mask substrate W by irradiation with a charged particle beam are discharged via the grounding body H. Moreover, the frame H2 of the grounding body H is grounded via the grounding pin H1$a$, so that electric charges accumulated in the frame H2 are discharged via the grounding pin H1$a$.

Figure 3:
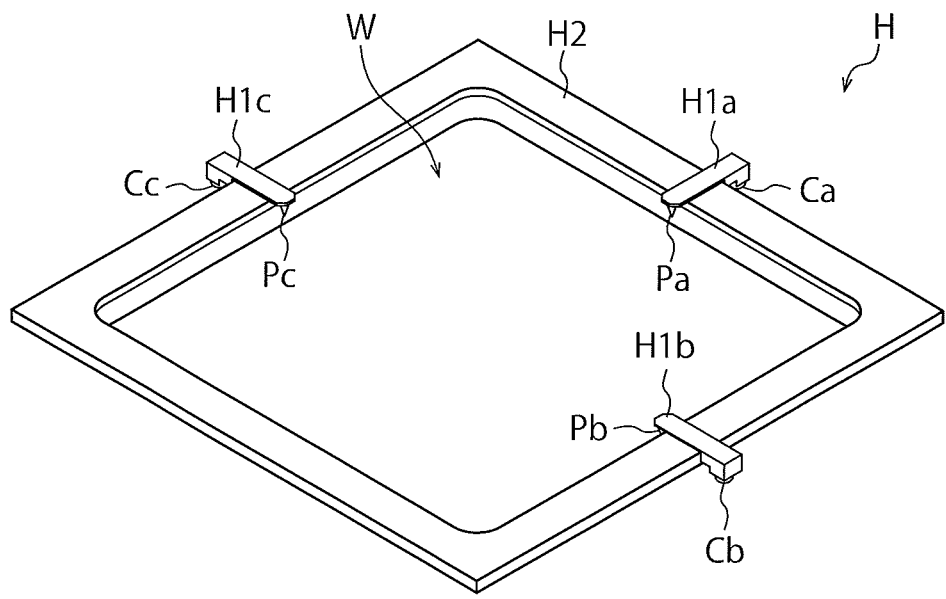
FIG. 3 is a perspective view showing the configuration of the grounding body more in detail.

FIG. 3 is a perspective view showing the configuration of the grounding body H more in detail. For example, the grounding pins H1$a$ to H1$c$ are metallic members that are fixed across the inner and outer edges of the frame H2. The grounding pins H1$a$ to H1$c$ have pin portions Pa to Pc, respectively, with sharp points on the inner edge side of the frame H2. As described above, when the grounding body H is set on the mask substrate W, the pin portions Pa to Pc break through the resist film We of the mask substrate W to be brought into contact with the light shielding film Wb. Moreover, the grounding pins H1$a$ to H1$c$ have connectors Ca to Cc, respectively, on the outer edge side of the frame H2. The connectors Ca to Cc are electrically connected to the pin portions Pa to Pc, respectively. The connectors Cb and Cc are provided for electrically connecting the grounding pins H1b and H1c to grounding springs.

Figure 4:
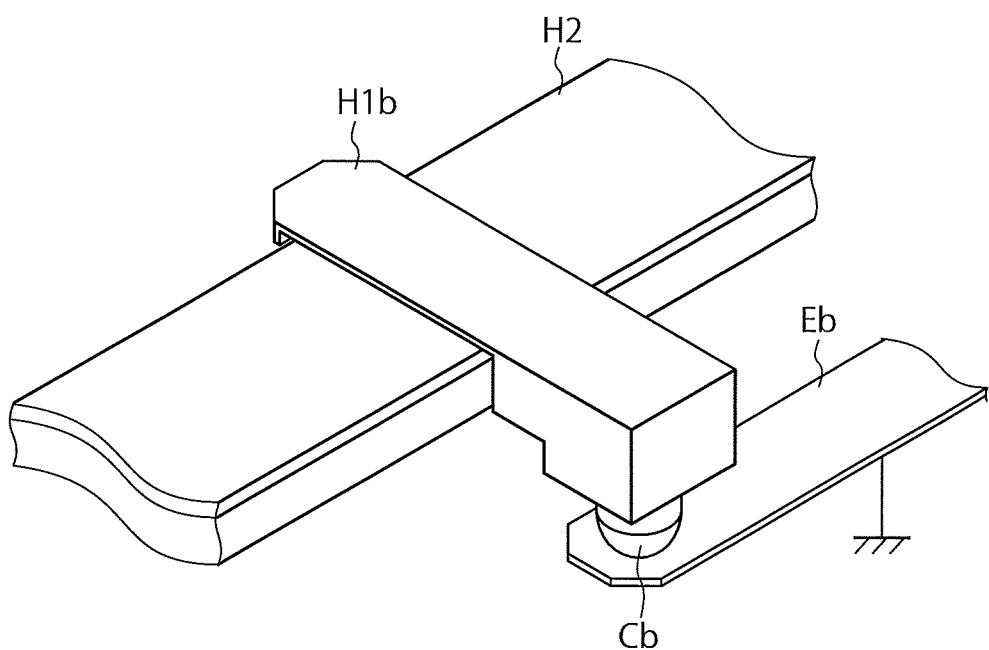
FIG. 4 is a perspective view showing the configurations of a grounding pin and a grounding spring more in detail.

FIG. 4 is a perspective view showing the configurations of the grounding pin H1b and a grounding spring Eb more in detail. Since the grounding pins H1a and H1c have the same configuration as the grounding pin H1b, the configuration of the grounding pin H1b will be explained here. It is, however, noted that the grounding pin H1a is disposed on a spring member having the same configuration as the grounding spring Eb, but that spring member is not grounded. The grounding pin H1a is electrically connected to the grounding pin H1b or H1c, with almost the same voltage. Therefore, during writing, the grounding pins H1b and H1c are grounded and the grounding pin H1a is grounded via the grounding pin H1b or H1c.

The grounding spring Eb as the second grounding member is provided within the W-chamber 400, which makes the light shielding film Wb of the mask substrate W grounded via the grounding pins H1b and H1c during writing. An end of the grounding spring Eb is connected to the grounded portion of the body or the like of the mask writing apparatus 10, the other end extending in an almost horizontal direction to be bought into contact with the connector Cb, as shown in FIG. 4. For the grounding spring Eb, for example, a conductive member such as titanium is used.

When the mask substrate W and the grounding body H are mounted on the grounding spring Eb, the connector Cb of the grounding pin H1b is brought into contact with the grounding spring Eb to be electrically conductive with the grounding spring Eb. In this way, the grounding pin H1b is grounded via the grounding spring Eb and then the mask substrate W is grounded via the grounding pin H1b and the grounding spring Eb.

Although not shown here, the connector Cc of the grounding pin H1c has a contact with its corresponding grounding spring to be electrically conductive with this grounding spring. In this way, the mask substrate W is grounded via the grounding pin H1c and the corresponding grounding spring.

As described above, in the W-chamber 400, the grounding pins H1a to H1c make the light shielding film Wb of the mask substrate W grounded via the grounding springs. In this way, during writing, electric charges accumulated in the light shielding film Wb caused by irradiation with a charged particle beam are discharged to the ground.

(Internal Configuration of H-Chamber 330)

Figure 5A:
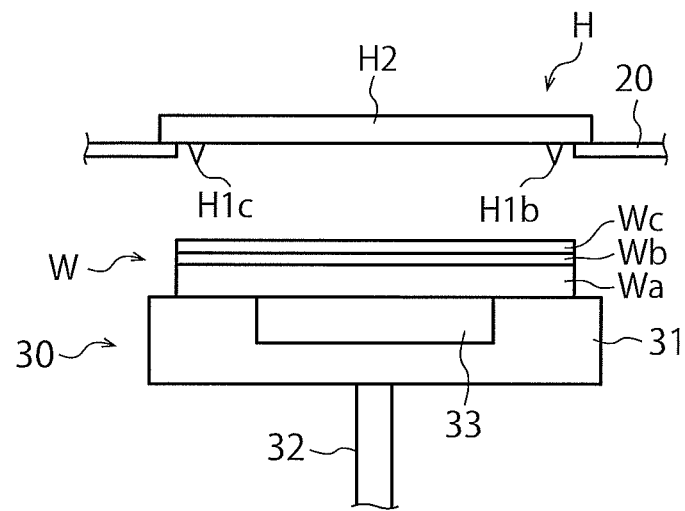
FIGS. 5A and 5B are schematic views of the inside of an H-chamber.
Figure 5B:
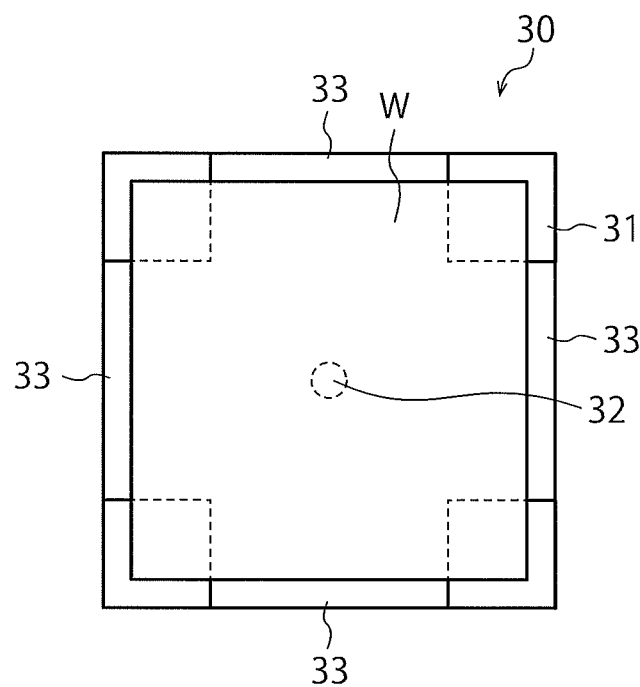

FIGS. 5A and 5B are schematic views of the inside of the H-chamber 330. FIG. 5A is a side view of the H-chamber 330. FIG. 5B is a plan view of the H-chamber 330. Hereinafter, referring to FIGS. 5A and 5B, the configuration of the H-chamber 330 will be explained.

As shown in FIG. 5A, a mount rack 20 on which the grounding body H is mounted, and a rotary mechanism 30 for rotating the mask substrate W are provided inside the H-chamber 330.

The rotary mechanism 30 is provided with a mount table 31 on which the mask substrate W is mounted, and a rotary shaft 32, an end of which is connected to the mount table 31. The mount table 31 is provided with undercuts 33, in four directions, to which the end effector 342 of the transfer robot 340 escapes. The rotary shaft 32 is connected at its other end to a motor (not shown) to be able to rotate the mount table 31 by 90 degrees per rotation.

The mount rack 20 moves the grounding body H up and down to mount the grounding body H on the mask substrate W. When the grounding body H is mounted on the mask substrate W, the grounding pins H1a to H1c of the grounding body H break through the resist film We due to the weight of the grounding body H to be brought into contact with the light shielding film Wb that is a conductor, which is the state shown in FIG. 2B.

(Internal Configuration of W-Chamber 400)

Figure 6:
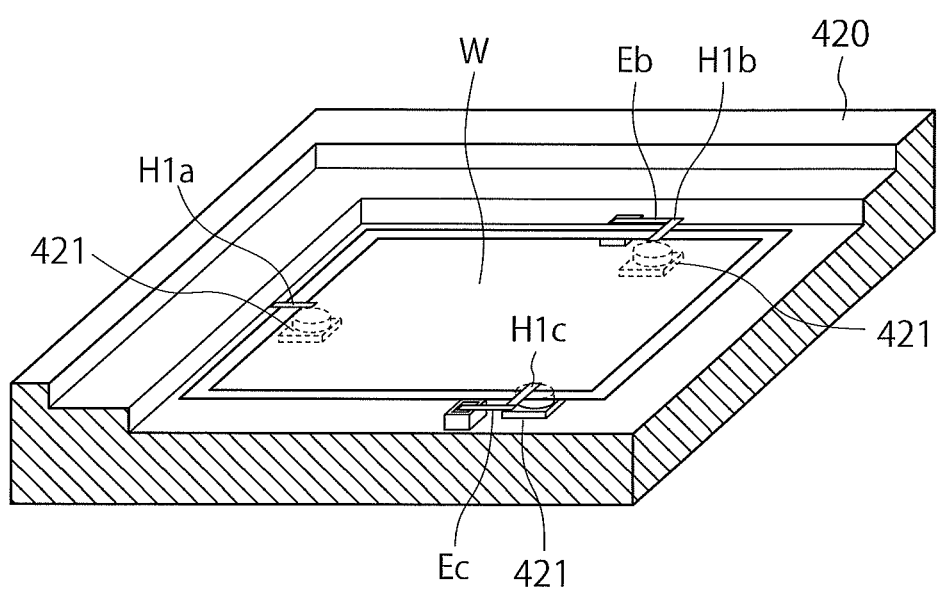
FIG. 6 is a schematic view of the inside of a W-chamber.

FIG. 6 is a schematic view of the inside of the W-chamber 400. The X-Y stage 420 in the W-chamber 400 is provided with a plurality of mask supporting members 421 for supporting the mask substrate W and, grounding springs Eb and Ec for grounding the mask substrate W. FIG. 6 shows a state in which the mask substrate W is mounted on the X-Y stage 420. The mask supporting members 421 support the mask substrate W and the grounding body H mounted on the X-Y stage 420 from below. The grounding springs Eb and Ec have a contact with the grounding pins H1b and H1c in an elastic manner, respectively, to ground the light shielding film Wb of the mask substrate W via the grounding pins H1b and H1c. As described above, in the W-chamber 400, writing is performed in the state where the mask substrate W is mounted on the X-Y stage 420 and is being grounded via the grounding springs Eb and Ec.

(Configuration of Resistance Measuring Unit 40 or 50)

Figure 7:
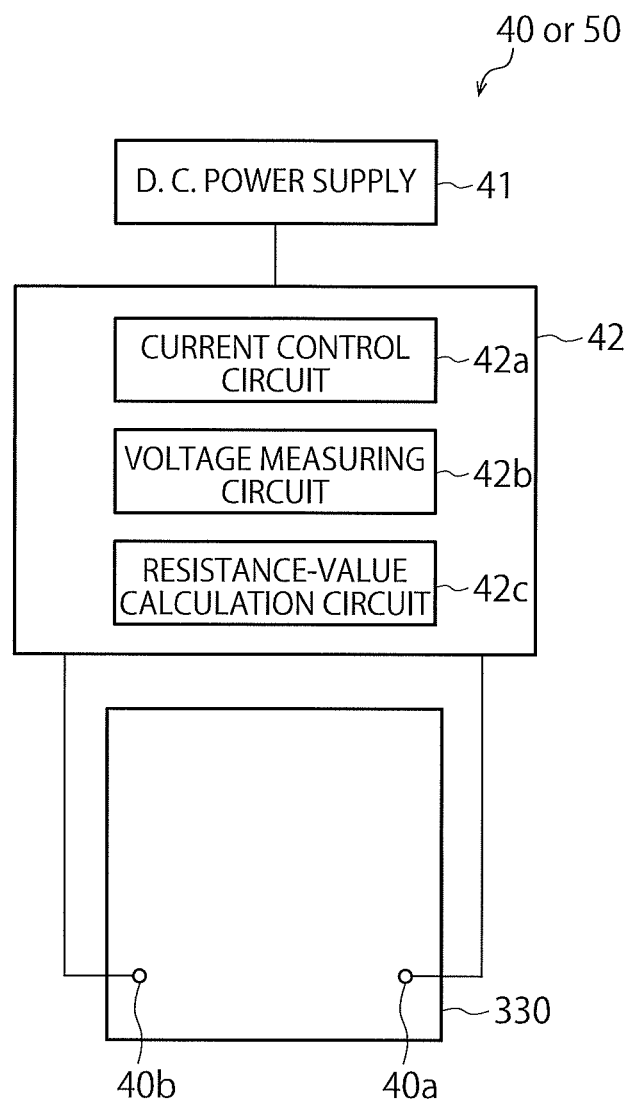
FIG. 7 is a block diagram of a resistance measuring unit.

FIG. 7 is a block diagram of the resistance measuring unit 40 or 50. The resistance measuring unit 50 basically has the same configuration as the resistance measuring unit 40, and hence the configuration of the resistance measuring unit 40 will be explained here.

The resistance measuring unit 40 is provided with a D. C. power supply 41 disposed outside the H-chamber 330 and with a controller 42 connected to the D. C. power supply 41. The controller 42 is provided with a current control circuit 42a, a voltage measuring circuit 42b, and a resistance-value calculation circuit 42c, to measure the electric resistance across terminals 40a and 40b. The terminals 40a and 40b are provided inside the H-chamber 330, connectable to the grounding pins H1b and H1c of the grounding body H described above.

The resistance measuring unit 40 measures a contact resistance value (resistance value) between the grounding body H and the mask substrate W in the state where the grounding body H is being set on the mask substrate W. Specifically, in the state where the grounding body H is being set on the mask substrate W, the current control circuit 42a supplies a current of a constant value across the terminals 40a and 40b, and then the voltage measuring circuit 42b measures a voltage across the terminals 40a and 40b. Then, the resistance-value calculation circuit 42c calculates a resistance value across the terminals 40a and 40b from a current value of the current flowing through the terminals 40a and 40b, and a measured voltage value thereacross. In measuring the resistance value, the terminals 40a and 40b of the resistance measuring unit 40 and the grounding pins H1b and H1c of the grounding body H are connected to each other. For example, the resistance measuring unit 40 has a plurality of measuring pins (see FIG. 8) connected to the terminals 40a and 40b. The measuring pins are brought into contact with the grounding pins H1b and H1c.

As described above, the grounding pin H1b or H1c is provided to the frame H2 via an insulator. Therefore, a current supplied from the current control circuit 42a flows through the terminals 40a and 40b via the grounding pins H1b and H1c, and the light shielding film Wb of the mask substrate W. The contact resistance value between the terminals 40a and 40b, and the grounding pins H1b and H1c is very small to be neglected. Therefore, in between the grounding pin H1b and the grounding pin H1c, for example, a resistance value between the grounding pins H1b and H1c, and the light shielding film Wb of the mask substrate W can be measured.

The resistance measuring unit 50 has the same configuration as the resistance measuring unit 40, shown in FIG. 7. However, the terminals of 40a and 40b of the resistance measuring unit 50 are connected to different grounding springs and, via the grounding springs, connected to the grounding pins H1b and H1c, respectively. Accordingly, the resistance measuring unit 50 can measure resistance values of the grounding springs, the grounding pins H1b and H1c, and the light shielding film Wb of the mask substrate W.

(Measurement of First and Second Resistance Values of Mask Substrate W)

Figure 8A:
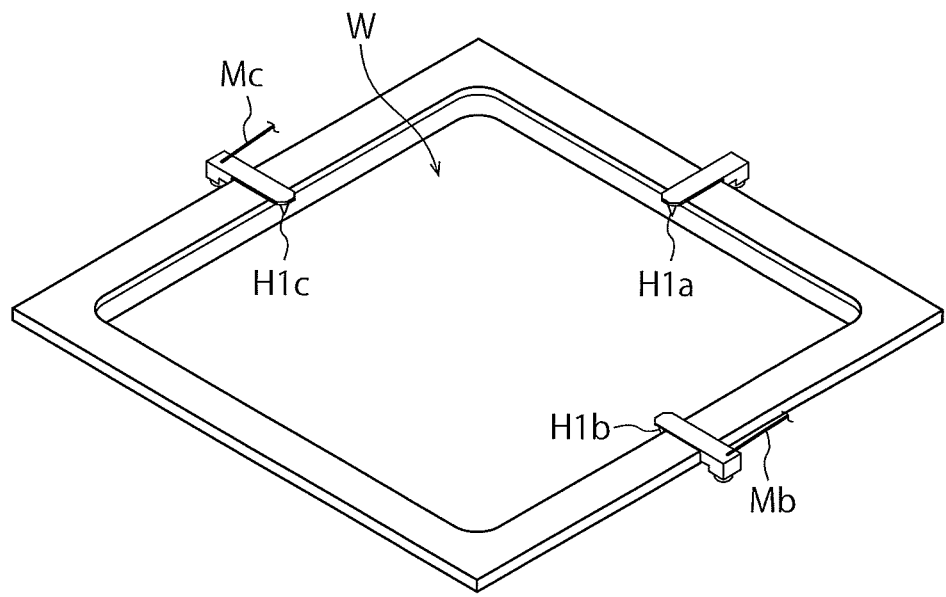
FIGS. 8A and 8B are schematic views showing measurement of a first resistance value of a mask substrate in the H-chamber.
Figure 8B:
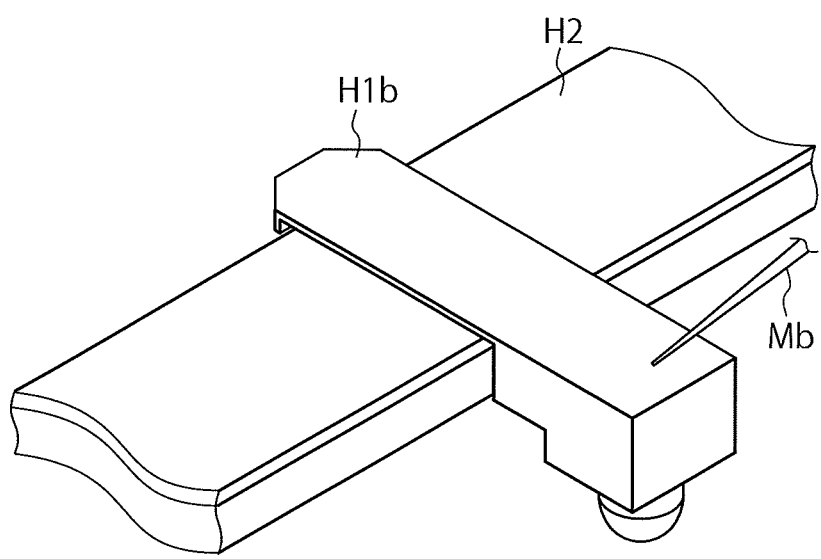

FIGS. 8A and 8B are schematic views showing measurement of a resistance value (first resistance value) of the mask substrate W in the H-chamber 330. Measuring pins Mb and Mc are connected to the terminals 40a and 40b of the resistance measuring unit 40, respectively. The resistance measuring unit 40 measures the first resistance value between the grounding pin H1b and the grounding pin H1c while the measuring pins Mb and Mc are brought into contact with the grounding pins H1b and H1c, respectively. The measuring pins Mb and Mc are brought into contact with the grounding pins H1b and H1c, respectively, with low resistance. Therefore, the first resistance value is almost equal to the resistance value of the light shielding film Wb of the mask substrate W.

Figure 9:
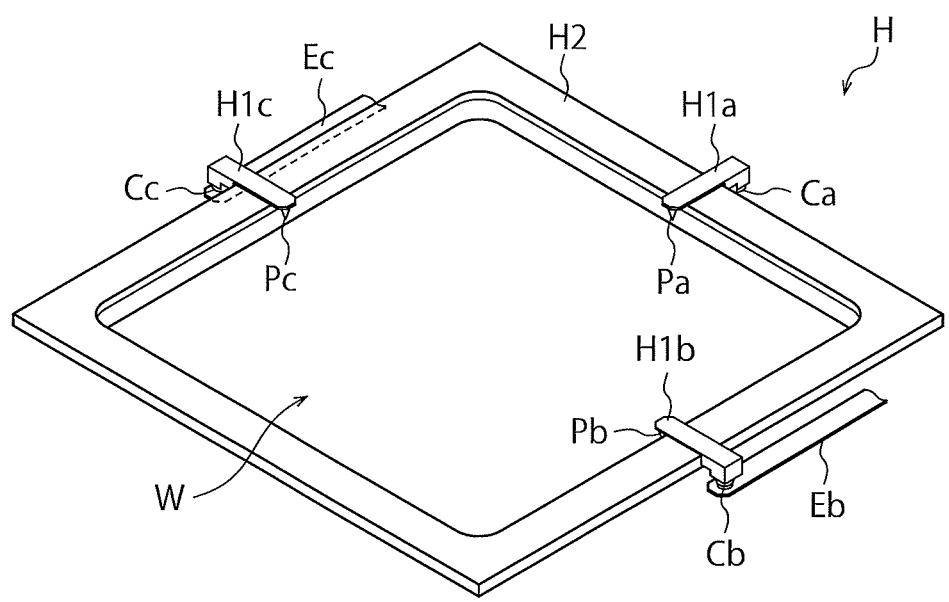
FIG. 9 is a schematic view showing measurement of a second resistance value of the mask substrate in the W-chamber.

FIG. 9 is a schematic view showing measurement of a resistance value (second resistance value) of the mask substrate W in the W-chamber 400. The second resistance value of the mask substrate W is measured via the grounding springs Eb and Ec. For example, as explained with reference to FIG. 6, when the mask substrate W is mounted on the X-Y stage 420 in the W-chamber 400, the grounding pins H1b and H1c are brought into contact with the grounding springs Eb and Ec, respectively. The connectors Cb and Cc of the grounding pins H1b and H1c are brought into contact with the grounding springs Eb and Ec to be electrically conductive with the grounding springs Eb and Ec, respectively.

As explained with reference to FIG. 4, during writing, the light shielding film Wb of the mask substrate W is grounded via the grounding pins H1b and H1c. Before and/or after writing, the resistance measuring unit 50 measures the resistance value between the grounding spring Eb and the grounding spring Ec. Through the measurement, the resistance value of the light shielding film Wb of the mask substrate W is measured via the grounding pins H1b and H1c, as the first grounding member, and the grounding springs Eb and Ec, as the second grounding member. In this measurement, different from the first resistance value, the second resistance value includes the contact resistance between the connectors Cb and Cc, and the grounding springs Eb and Ec. Therefore, the second resistance value measured in the W-chamber 400, which is although little bit larger than the first resistance value measured in the H-chamber 330, must have a value close to the first resistance value in the case where the connectors Cb and Cc have a contact with the grounding springs Eb and Ec, respectively, with sufficiently low resistance. However, when there is a contact failure between the connectors Cb and Cc, and the grounding springs Eb and Ec, the second resistance value has a remarkably higher resistance value than the first resistance value. Therefore, the resistance difference between the first resistance value and the second resistance value can be used as a parameter expressing a contact condition between the connectors Cb and Cc, and the grounding springs Eb and Ec. Accordingly, the mask writing apparatus 10 according to the present embodiment determines the anomaly of the grounding springs Eb and Ec based on the trend of the resistance difference between the first resistance value and the second resistance value.

(Operation of Mask Writing Apparatus 10)

Figure 10:
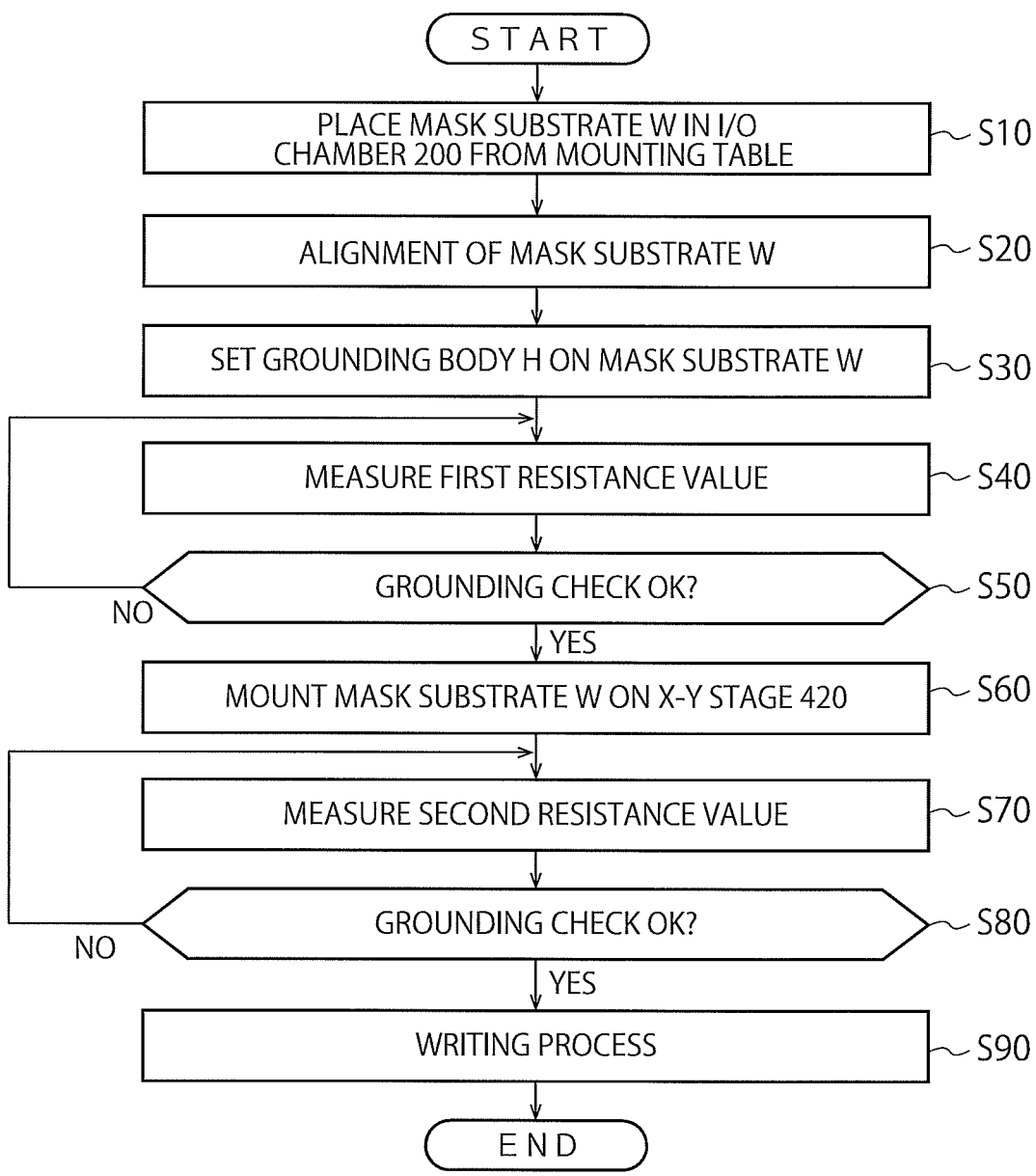
FIG. 10 is a flowchart showing an example of the operation of the mask writing apparatus.

An operation of the mask writing apparatus 10 will be explained next. FIG. 10 is a flowchart showing an example of the operation of the mask writing apparatus 10. The mask writing apparatus 10 is under control by the control mechanism 600. The anomaly of the grounding springs Eb and Ec is determined by the arithmetic processing unit 700.

Firstly, the container C in which the mask substrate W is housed is mounted on the mounting table 110. The transfer robot 120 takes out the mask substrate W from the container C. Subsequently, the I/O chamber 200 is set at an atmospheric pressure and then the gate valve G1 is opened.

The transfer robot 120 places the mask substrate W in the I/O chamber 200 and then reaves the I/O chamber 200 (S10). Then, the gate valve G1 is closed. After the I/O chamber 200 is vacuumed to a predetermined pressure, the gate valve G2 is opened. Subsequently, the transfer robot 340 takes out the mask substrate W from the I/O chamber 200. Thereafter, the gate valve G2 is closed.

Then, the transfer robot 340 transfers the mask substrate W into the ALN chamber 320. And then, positioning (alignment) of the mask substrate W is performed in the ALN chamber 320 (S20).

After the alignment, the transfer robot 340 transfers the mask substrate W into the H-chamber 330 and then sets the grounding body H, which has been mounted on the mount rack 20 in the H-chamber 330, on the mask substrate W (S30). The resistance measuring unit 40 of the H-chamber 330 brings the measuring pins Mb and Mc into contact with the grounding pins H1b and H1c, respectively, to measure the first resistance value of the light shielding film Wb of the mask substrate W via the grounding pins H1b and H1c (S40). The arithmetic processing unit 700 stores the first resistance value measured by the resistance measuring unit 40 in the memory 702.

The MPU 701 of the arithmetic processing unit 700 uses the first resistance value to perform a grounding check (S50). The grounding check is a process of confirming that the grounding pins H1b and H1c are electrically connected to the light shielding film Wb of the mask substrate W, so that the mask substrate W can be grounded. The MPU 701 compares the first resistance value with a predetermined value. If the first resistance value is equal to or larger than the predetermined value, the MPU 701 determines a grounding error (NO in S50). When the grounding error occurs, the measuring pins Mb and Mc are moved up and down to perform the measurement of the first resistance value again (S40, S50).

If the first resistance value is smaller than the predetermined value, the MPU 701 determines that the mask substrate W has a normal resistance value and hence can be grounded (YES in S50).

Subsequently, the gate valve G3 is opened and then the transfer robot 340 mounts the mask substrate W on the X-Y stage 420 in the W-chamber 400 (S60). After the transfer robot 340 leaves the W-chamber 400, the gate valve G3 is closed. Having the mask substrate W mounted on the X-Y stage 420, the connectors Cb and Cc of the grounding pins H1b and H1c, respectively, are brought into contact with the grounding springs Eb and Ec, respectively, provided in the W-chamber 400.

Subsequently, the resistance measuring unit 50 of the W-chamber 400 measures the second resistance value of the light shielding film Wb of the mask substrate W via the grounding springs Eb and Ec, and the grounding pins H1b and H1c (S70). The control mechanism 600 stores the second resistance value measured by the resistance measuring unit 50 in the memory 702.

Subsequently, the MPU 701 of the arithmetic processing unit 700 uses the second resistance value to perform a grounding check (S80). The grounding check is a process of applying a voltage to the light shielding film Wb of the mask substrate W via the grounding pins H1b and H1c, and the grounding springs Eb and Ec to confirm that the light shielding film Wb is grounded. The MPU 701 compares the second resistance value with a predetermined value. If the second resistance value is equal to or larger than the predetermined value (NO in S80), the MPU 701 determines a grounding error. When the grounding error occurs, the voltage is applied to the light shielding film Wb again to perform the grounding check again (S70, S80).

When the grounding error occurs even if grounding checks in steps S50 and S80 are performed a predetermined number of times, the process ends without a writing process (S90). In this case, as explained later with reference to FIG. 11, anomaly detection of the grounding springs Eb and Ec is performed.

If the second resistance value is smaller than the predetermined value (YES in S80), the MPU 701 determines that the mask substrate W has a normal resistance value and is in a grounded state. In this case, the mask substrate W is irradiated with a charged particle beam in the W-chamber 400, so that a desired pattern is written on the light shielding film Wb of the mask substrate W (S90). During the pattern writing, electric charges accumulated in the mask substrate W flow to the ground via the grounding pins H1b and H1c, and the grounding springs Eb and Ec. Therefore, electrification of the mask substrate W during writing can be restricted.

When writing on the mask substrate W is complete, the drive mechanisms 430A and 430B move the X-Y stage 420 to a predetermined position. Subsequently, the gate valve G3 is opened and then the transfer robot 340 takes out the mask substrate W from the W-chamber 400. Then, the gate valve G3 is closed. The transfer robot 340 transfers the mask substrate W into the H-chamber 330 and houses the grounding body H in the H-chamber 330 in a reverse order of setting the grounding body H on the mask substrate W.

Subsequently, the gate valve G2 is opened, and the transfer robot 340 places the mask substrate W in the I/O chamber 200 and then leaves the I/O chamber 200. Then, the gate valve G2 is closed. The gas supply system 220 supplies the vent gas into the I/O chamber 200 to increase the pressure therein to the atmospheric pressure and then the gate valve G1 is opened.

The transfer robot 120 takes out the mask substrate W from the I/O chamber 200 and then leaves the I/O chamber 200. Then, the gate valve G1 is closed. Subsequently, the transfer robot 120 houses the mask substrate W in the container C. As described above, the mask writing apparatus 10 performs the mask-substrate grounding check to execute a writing process.

Not only the anomaly of the resistance value of the mask substrate W itself, there are other factors of the grounding error such as an anomaly of the grounding springs Eb and Ec. The grounding check is a process performed to each mask substrate W, not a process of confirming the trend (variation or tendency) of the mask-substrate resistance value over a plurality of mask substrates W. Therefore, it is difficult by the grounding check to determine whether the grounding springs Eb and Ec have been gradually deteriorated (oxidized).

Figure 11:
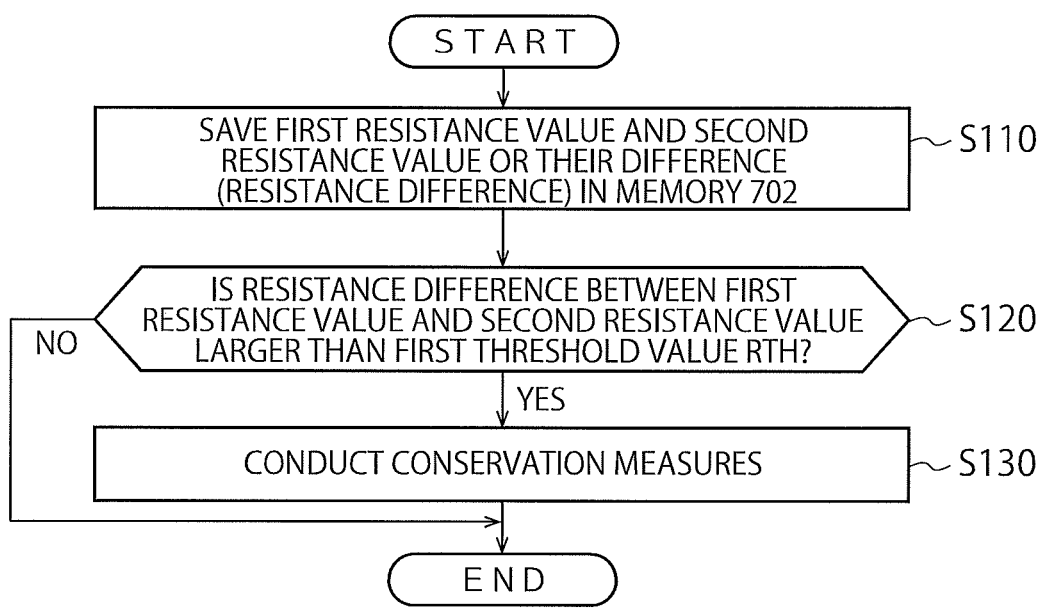
FIG. 11 is a flowchart showing an example of an anomaly determination method of grounding springs.

FIG. 11 is a flowchart showing an example of an anomaly determination method for the grounding springs Eb and Ec. The MPU 701 of the arithmetic processing unit 700 saves (stores) in the memory 702 the first resistance value and the second resistance value measured in steps S40 and S70, respectively, of FIG. 10 or the difference (resistance difference) between these resistance values, per writing process to each mask substrate W (S110). The trend (variation or tendency) of the resistance difference for a plurality of mask substrates W can be obtained by the writing process to the plurality of mask substrates W. According to the present embodiment, the MPU 701 determines the anomaly of the grounding springs Eb and Ec based on the trend of the resistance difference for the plurality of mask substrates W (S120).

Figure 12:
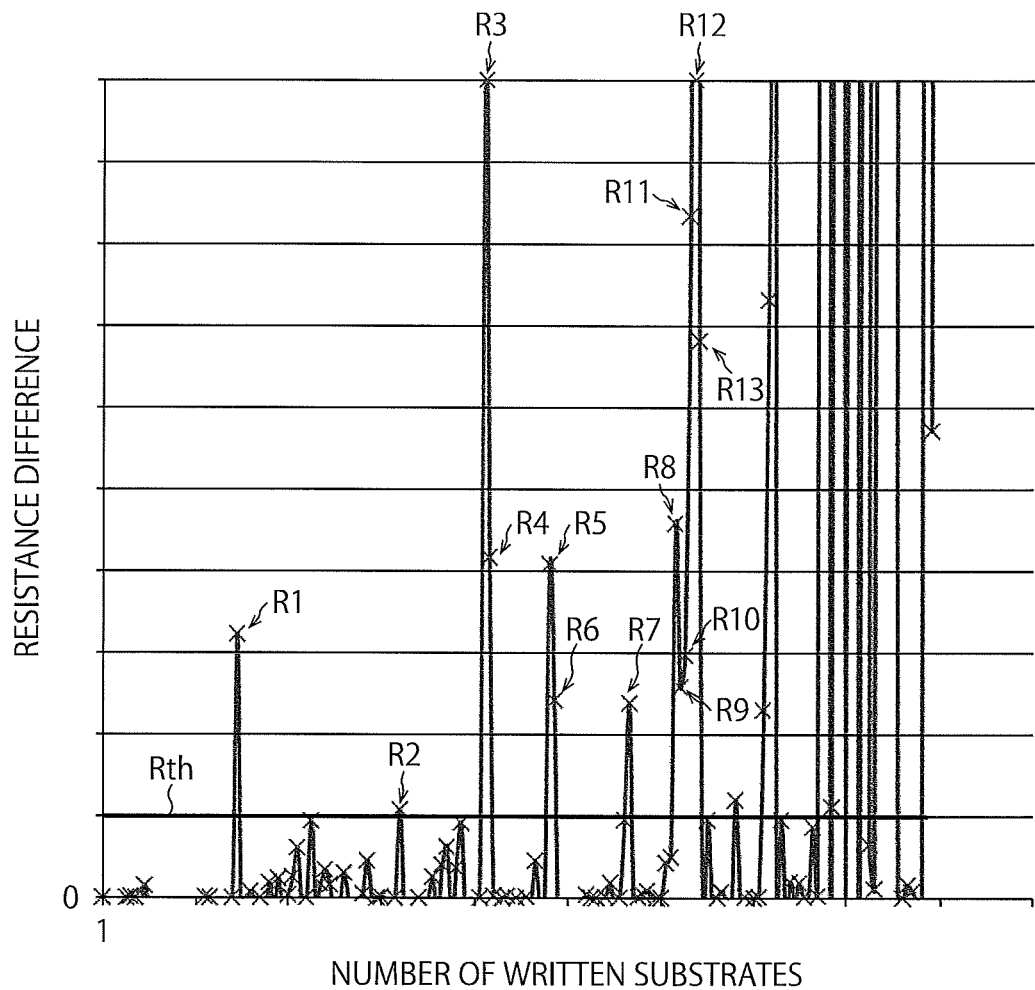
FIG. 12 is a graph for explaining the anomaly determination of the grounding springs.

For example, FIG. 12 is a graph for explaining the anomaly determination of the grounding springs Eb and Ec. In this graph, the abscissa is the number of processed mask substrates W and the ordinate is the resistance difference between the first resistance value and the second resistance value. The MPU 701 saves (stores) in the memory 702 the first resistance value and the second resistance value or the resistance difference between the first and second resistance values, per writing process to each mask substrate W. Accordingly, the arithmetic processing unit 700 can obtain the history of the first and second resistance values or of the resistance difference between the first and second resistance values for a plurality of mask substrates W.

Referring to FIG. 11 again, the MPU 701 compares the resistance difference between the first resistance value and the second resistance value with a first threshold value Rth to determine that the grounding springs Eb and Ec are normal if the resistance difference is smaller than the first threshold value Rth (NO in S120).

When the writing process to the mask substrates W is repeated and hence the surfaces of the grounding springs Eb and Ec are oxidized, for example, an insulator such as titanium oxide is formed on the surfaces of the grounding springs Eb and Ec. In this case, the contact resistance between the grounding pins H1b and H1c, and the grounding springs Eb and Ec increases to raise the second resistance value. Accordingly, the resistance difference between the first resistance value and the second resistance value (for example, the second resistance value–the first resistance value) becomes larger. However, even if the resistance difference between the first resistance value and the second resistance value transitionally surpasses the first threshold value Rth for one mask substrate W, this may occur due to any factors other than the grounding springs Eb and Ec, as described above. Therefore, the MPU 701 does not determine the anomaly of the grounding springs Eb and Ec even if the resistance difference surpasses the first threshold value Rth just for one mask substrate W. For example, a resistance difference R1 in FIG. 12 surpasses the first threshold value Rth. However, the MPU 701 does not determine the anomaly of the grounding springs Eb and Ec at this stage.

The MPU 701 may find out the trend in resistance difference between the first resistance value and the second resistance value by the number of times the resistance difference surpasses the first threshold value Rth. In this case, the MPU 701 determines the anomaly of the grounding springs Eb and Ec based on the number of times the resistance difference surpasses the first threshold value Rth.

For example, when the number of times the resistance difference surpasses the first threshold value Rth surpasses a second threshold value, the MPU 701 may determine that there is an anomaly in the grounding springs Eb and Ec. In the case where the second threshold value is set to seven, the MPU 701 determines that there is an anomaly in the grounding springs Eb and Ec when a resistance difference R8 in FIG. 12 is obtained.

The anomaly determination of the grounding springs Eb and Ec may be performed, not only by the number of times the resistance difference surpasses the first threshold value Rth, but also using other parameters. For example, the MPU 701 may determine the anomaly of the grounding springs Eb and Ec based on a frequency (density) at which the resistance difference surpasses the first threshold value Rth. When the frequency (density) at which the resistance difference surpasses the first threshold value Rth becomes equal to or larger than the half (50%) of the number of written mask substrates W, the MPU 701 determines that there is an anomaly in the grounding springs Eb and Ec.

For example, the MPU 701 may determine the anomaly of the grounding springs Eb and Ec based on a consecutive number of times the resistance difference surpasses the first threshold value Rth. When the consecutive number of events in which the resistance difference surpasses the first threshold value Rth becomes equal to or larger than a third threshold value, the MPU 701 determines that there is an anomaly in the grounding springs Eb and Ec.

The MPU 701 compares the resistance difference between the first resistance value and the second resistance value with the first threshold value Rth, and when the resistance difference is equal to or larger than the first threshold value Rth (YES in S120), determines that there is an anomaly in the grounding springs Eb and Ec. When it is determined that there is an anomaly in the grounding springs Eb and Ec, in order to decrease the contact resistance between the grounding springs Eb and Ec, and the grounding pins H1b and H1c, the arithmetic processing unit 700 transmits an instruction to the control mechanism 600 to take conservation measures to the grounding body H or the grounding springs Eb and Ec (S130). For example, the transfer robot 340 shifts the contact position of the grounding body H or the grounding body H is replaced with a new one. Or the grounding springs Eb and Ec themselves may be replaced with new ones.

The anomaly detection of the grounding springs Eb and Ec described above may be performed at any time after the first and second resistance values are obtained in steps S40 and S70, respectively, shown in FIG. 10.

In the above embodiment, the second resistance value is measured in the W-chamber 400 before the writing process. However, the second resistance value may be measured after the writing process. There may a case in which the second resistance value is measured before and after the writing process. In this case, either one or both of the second resistance values measured before and after the writing process may be used. When both of the second resistance values measured before and after the writing process are used, the resistance difference may be the difference between an average value of the second resistance values measured before and after the writing process, and the first resistance value. Or when both of the second resistance values measured before and after the writing process are used, the arithmetic processing unit 700 may use either one of the second resistance values measured before and after the writing process, which has a larger difference than the other second resistance value with the first resistance value.

According to the anomaly determination method of the present embodiment, the arithmetic processing unit 700 uses the resistance difference between the first resistance value of a mask substrate W measured via the grounding pins H1b and H1c, and the second resistance values of a plurality of mask substrates W measured via the grounding pins H1b and H1c, and the grounding springs Eb and Ec, to determine the anomaly of the grounding springs Eb and Ec. The first resistance value does not include the contact resistance between the grounding pins H1b and H1c, and the grounding springs Eb and Ec whereas the second resistance value includes the contact resistance between the grounding pins H1b and H1c, and the grounding springs Eb and Ec. Therefore, the resistance difference can be used for determination of degradation (for example, oxidation) of the grounding springs Eb and Ec. In contrast, the connectors Cb and Cc of the grounding pins H1b and H1c, respectively, are subjected to a maintenance per writing process, and hence the degradation of the connectors Cb and Cc may not be considered.

Moreover, according to the present embodiment, different from the grounding checks in the H-chamber 330 and W-chamber 400, the anomaly determination of the grounding springs Eb and Ec is performed based on the trend (variation or tendency) of the resistance difference between the first resistance value and the second resistance value. Therefore, before the occurrence of a grounding error caused by the grounding springs, the arithmetic processing unit 700 can find out the change or deterioration of the grounding springs Eb and Ec based on the trend of the resistance difference between the first resistance value and the second resistance value. Accordingly, the anomaly of the grounding springs Eb and Ec can be found out in an early stage, so that other grounding springs Eb and Ec or another grounding body H can be prepared in advance. As a result, the suspension period (downtime) of the mask writing apparatus 10 can be shortened.

Moreover, the arithmetic processing unit 700 determines the anomaly of the grounding springs Eb and Ec based on the trend of the resistance difference for a plurality of mask substrates W. When an oxide film is formed on the surfaces of the grounding springs Eb and Ec, the contact resistance between the grounding pins H1b and H1c, and the grounding springs Eb and Ec becomes higher constantly, so that the resistance difference becomes larger accordingly. Therefore, the arithmetic processing unit 700 can restrict erroneous determination of other anomaly occurred suddenly as the anomaly of the grounding springs Eb and Ec, and hence can determine the anomaly of the grounding springs Eb and Ec more accurately.

Second Embodiment

Figure 13:
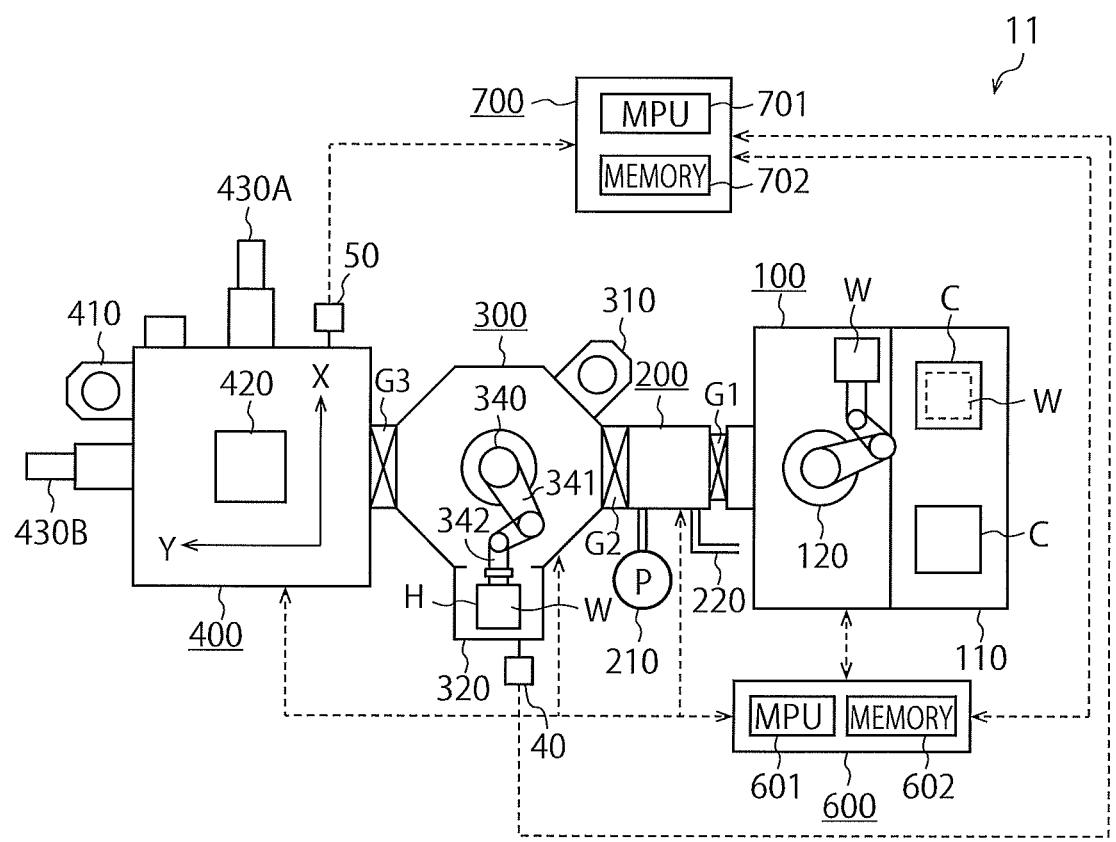
FIG. 13 is a schematic view of a mask writing apparatus according to a second embodiment.

FIG. 13 is a schematic view of a mask writing apparatus according to a second embodiment. In the second embodiment, the ALN chamber (alignment chamber) 320 is provided with the resistance measuring unit 40.

The mask writing apparatus 11 according to the second embodiment places the grounding body H on standby on an elevation stage to perform positioning of the mask substrate W. After the completion of positioning, the resistance measuring unit 40 attaches the grounding body H to the mask substrate W to measure a resistance value (first resistance value) of the light shielding film Wb of the mask substrate W in the ALN chamber 320. The measurement method of the first resistance value may be the same as the measurement method of the first resistance value in the first embodiment. The determination method of the anomaly of the grounding springs Eb and Ec in the second embodiment may also be the same as that of the first embodiment. Moreover, the other configuration of the mask writing apparatus 11 according to the second embodiment may be the same as the configuration of the first embodiment. Accordingly, the second embodiment can achieve the same effects as the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An anomaly determination method using a writing apparatus, the writing apparatus comprising a first chamber capable of attaching a first grounding body to a processing target which has a conductive film and a resist film stacked on a substrate, the first grounding body configured to ground the processing target, or of accommodating the processing target for positioning the processing target, a second chamber capable of accommodating the processing target for writing a predetermined pattern to the processing target with a charged particle beam, and an arithmetic processing circuitry configured to determine a resistance value of the processing target, the method comprising:
    measuring a first resistance value of the processing target via the first grounding body and determining whether the first resistance value is less than a predetermined value, after the first grounding body is attached to the processing target and a pin portion of the first ground body breaks through the resist film to contact the conductive film, in the first chamber;
    transferring the first grounding body to the second chamber while being attached to the processing target, after measuring the first resistance value;
    bringing the first grounding body into contact with a second grounding body while being attached to the processing target in the second chamber, the second grounding body being configured to measure a second resistance value of the processing target via the first and second grounding bodies;
    determining an anomaly of the second grounding body with the arithmetic processing circuitry based on a trend of a resistance difference between the first resistance value and the second resistance value for a plurality of processing targets; and
    releasing electric charges accumulated in the processing target to ground via the first grounding body.

2. The method according to claim 1, wherein the arithmetic processing circuitry is configured to determine the anomaly of the second grounding body based on a number of times the resistance difference surpasses a first threshold value.

3. The method according to claim 2, wherein the arithmetic processing circuitry is configured to determine that there is the anomaly in the second grounding body when the number of times surpasses a second threshold value.

4. The method according to claim 1, wherein the arithmetic processing circuitry is configured to determine the anomaly of the second grounding body based on a frequency at which the resistance difference surpasses a first threshold value.

5. The method according to claim 2, wherein the arithmetic processing circuitry is configured to determine the anomaly of the second grounding body based on a frequency at which the resistance difference surpasses the first threshold value.

6. The method according to claim 3, wherein the arithmetic processing circuitry is configured to determine the anomaly of the second grounding body based on a frequency at which the resistance difference surpasses the first threshold value.

7. The method according to claim 1, further comprising:
    writing the predetermined pattern to the processing target with the charged particle beam in the second chamber when it is determined that there is no anomaly in the second grounding body; and
    shifting a contact point of the first grounding body with respect to the second grounding body when it is determined that there is the anomaly in the second grounding body.

8. The method according to claim 2, further comprising:
    writing the predetermined pattern to the processing target with the charged particle beam in the second chamber when it is determined that there is no anomaly in the second grounding body; and
    shifting a contact point of the first grounding body with respect to the second grounding body when it is determined that there is the anomaly in the second grounding body.

9. The method according to claim 3, further comprising:
    writing the predetermined pattern to the processing target with the charged particle beam in the second chamber when it is determined that there is no anomaly in the second grounding body; and
    shifting a contact point of the first grounding body with respect to the second grounding body when it is determined that there is the anomaly in the second grounding body.

10. The method according to claim 4, further comprising:
    writing the predetermined pattern to the processing target with the charged particle beam in the second chamber when it is determined that there is no anomaly in the second grounding body; and
    shifting a contact point of the first grounding body with respect to the second grounding body when it is determined that there is the anomaly in the second grounding body.

11. A writing apparatus comprising:
    a first chamber capable of attaching a first grounding body to a processing target to ground the processing target or of accommodating the processing target for positioning the processing target which has a conductive film and a resist film stacked on a substrate;
    a second chamber capable of accommodating the processing target for writing a predetermined pattern to the processing target with a charged particle beam;
    a first resistance measuring circuitry configured to measure a first resistance value of the processing target via the first grounding body and determining whether the first resistance value is less than a predetermined value, after the first grounding body grounding the processing target is attached to the processing target and a pin portion of the first grounding body breaks through the resist film to contact the conductive film;

a second resistance measuring circuitry configured to bring the first grounding body into contact with a second grounding body and measuring a second resistance value of the processing target mounted on the second grounding body via the first and second grounding bodies, while the first grounding body is attached to the processing target, when writing to the processing target in the second chamber; and an arithmetic processing circuitry configured to determine an anomaly of the second grounding body based on a trend of a resistance difference between the first resistance value and the second resistance value for a plurality of processing targets, wherein the first grounding body releases electric charges accumulated in the processing target to ground.

12. The apparatus according to claim 11, wherein the arithmetic processing circuitry is configured to determine the anomaly of the second grounding body based on a number of times the resistance difference surpasses a first threshold value.

13. The apparatus according to claim 12, wherein the arithmetic processing circuitry is configured to determine the anomaly of the second grounding body when the number of times surpasses a second threshold value.

14. The apparatus according to claim 11, wherein the arithmetic processing circuitry is configured to determine the anomaly of the second grounding body based on a frequency at which the resistance difference surpasses a first threshold value.

15. The apparatus according to claim 11, wherein, when it is determined that there is no anomaly in the second grounding body, the predetermined pattern is written to the processing target with the charged particle beam in the second chamber; and when it is determined that there is the anomaly in the second grounding body, a contact point of the first grounding body with respect to the second grounding body is shifted.

* * * * *